(12) United States Patent
Hu et al.

(10) Patent No.: US 9,651,839 B2
(45) Date of Patent: May 16, 2017

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Like Hu, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 14/438,644

(22) PCT Filed: Aug. 20, 2014

(86) PCT No.: PCT/CN2014/084798
§ 371 (c)(1),
(2) Date: Apr. 27, 2015

(87) PCT Pub. No.: WO2015/131498
PCT Pub. Date: Sep. 11, 2015

(65) Prior Publication Data
US 2016/0291431 A1  Oct. 6, 2016

(30) Foreign Application Priority Data
Mar. 7, 2014  (CN) .......................... 2014 1 0083723

(51) Int. Cl.
H01L 21/02  (2006.01)
G02F 1/1362  (2006.01)
(Continued)

(52) U.S. Cl.
CPC ...... *G02F 1/136209* (2013.01); *G02F 1/1368* (2013.01); *H01L 21/0262* (2013.01);
(Continued)

(58) Field of Classification Search
CPC ......... H01L 21/02592; H01L 21/02595; H01L 29/78633
See application file for complete search history.

(56) References Cited

U.S. PATENT DOCUMENTS

2013/0099290 A1* 4/2013 Itoh .................. H01L 21/02532
257/225
2013/0234144 A1  9/2013 Seo et al.

FOREIGN PATENT DOCUMENTS

CN  1288254 A  3/2001
CN  1525554 A  9/2004
(Continued)

OTHER PUBLICATIONS

Office Action dated Mar. 4, 2016 issued in corresponding Chinese Application No. 201410083723.2.
(Continued)

*Primary Examiner* — Tran Tran
(74) *Attorney, Agent, or Firm* — Nath, Goldberg & Meyer; Joshua B. Goldberg; Christopher Thomas

(57) ABSTRACT

The present invention provides an array substrate and a manufacturing method thereof, a display panel and a display device. The manufacturing method of an array substrate in the present invention comprises: forming light-shielding layers on the base substrate through a patterning process by using a light-shielding layer-doping multiplexing mask plate; and performing doping of CMOS transistors by using the light-shielding layer-doping multiplexing mask plate. In the invention, two mask plates used in manufacturing the light-shielding layer and the doping process in the prior art
(Continued)

are replaced with one light-shielding layer-doping multiplexing mask plate, therefore the number of the mask plates during manufacturing is reduced and the cost is decreased. Meanwhile, providing of the light-shielding layer below the N type transistors in the driving region of the array substrate may prevent light-induced leakage current from being generated in the conductive region.

6 Claims, 3 Drawing Sheets

(51) Int. Cl.
*H01L 21/77* (2017.01)
*H01L 27/12* (2006.01)
*G02F 1/1368* (2006.01)
*H01L 29/66* (2006.01)
*H01L 29/786* (2006.01)
*G02F 1/1333* (2006.01)
*H01L 27/092* (2006.01)

(52) U.S. Cl.
CPC .. *H01L 21/02532* (2013.01); *H01L 21/02592* (2013.01); *H01L 21/02595* (2013.01); *H01L 21/02667* (2013.01); *H01L 21/77* (2013.01); *H01L 27/12* (2013.01); *H01L 27/1218* (2013.01); *H01L 27/1222* (2013.01); *H01L 27/1274* (2013.01); *H01L 27/1288* (2013.01); *H01L 29/66757* (2013.01); *H01L 29/78633* (2013.01); *H01L 29/78675* (2013.01); *G02F 2001/133357* (2013.01); *G02F 2001/136231* (2013.01); *G02F 2202/104* (2013.01); *H01L 27/092* (2013.01)

(56) References Cited

FOREIGN PATENT DOCUMENTS

| | | |
|---|---|---|
| CN | 101226948 A | 7/2008 |
| CN | 102253548 A | 11/2011 |
| JP | 10189999 A | 7/1998 |

OTHER PUBLICATIONS

Written Opinion of the International Searching Authority dated Dec. 2, 2014 corresponding to International application No. PCT/CN2014/084798.

International Search Report dated Aug. 20, 2014 corresponding to International application No. PCT/CN2014/084798.

* cited by examiner

ARRAY SUBSTRATE AND MANUFACTURING METHOD THEREOF, DISPLAY PANEL AND DISPLAY DEVICE

This is a National Phase Application filed under 35 U.S.C. 371 as a national stage of PCT/CN2014/084798, filed Aug. 20, 2014, an application claiming the benefit of Chinese Application No. 201410083723.2, filed Mar. 7, 2014, the content of each of which is hereby incorporated by reference in its entirety.

FIELD OF THE INVENTION

The present invention relates to the field of display technology, and particularly to an array substrate and a manufacturing method thereof, a display panel comprising the array substrate and a display device.

BACKGROUND OF THE INVENTION

Currently, liquid crystal display technology is more and more widely used in various fields of life. The liquid crystal display technology generally includes a-Si (amorphous silicon) thin film transistor liquid crystal display (TFT-LCD) and low temperature poly-silicon (LTPS) thin film transistor liquid crystal display (TFT-LCD).

In the prior art, the a-Si TFT-LCD cannot meet the requirements on low-profile, power saving and high image quality due to the limitation of the carrier mobility, however, the LTPS TFT-LCD has increasingly become mainstream product in liquid crystal display due to its advantages such as high image refreshing speed, high brightness and high definition. However, the method for manufacturing the LTPS TFT-LCD is complex, and generally requires 8 to 10 photolithographs, therefore, reducing the number of mask plates so as to decrease manufacturing cost has become a requirement to be met urgently for manufacturers.

With increasing in integration of semiconductor devices, a P type transistor and an N type transistor with an advantage of low energy consumption are widely used in manufacturing the array substrate of the LTPS TFT-LCD.

As shown in FIG. 1 and FIG. 2, a typical array substrate including a P type transistor and N type transistors comprises: a base substrate 1; light-shielding layers 2 provided on the base substrate; a buffer layer 3 provided on the light-shielding layers 2; a P type transistor and N type transistors provided on the buffer layer 3, wherein N type transistors are provided in a display region, and a N type transistor and a P type transistor are provided in a driving region. The light-shielding layers 2 are provided below the active layers of the N type transistors in the display region of the array substrate, wherein the active layer of the N type transistor sequentially includes a conductive region 19 and heavy doping regions 6 of the N type transistor from the center to two sides thereof, the conductive region 19 includes a channel region 4 of the N type transistor, light doping regions 5 of the N type transistor, and the active layer of the P type transistor includes a channel region 8 of the P type transistor in the center and heavy doping regions 7 of the P type transistor at ends thereof.

As shown in FIG. 1 and FIG. 2, with respect to each of the N type transistor and the P type transistor, an insulation layer 9 is provided on the active layer, a gate 10 is provided on the insulation layer 9, a source 12 and a drain 13 are provided above the gate 10, the source 12 and the drain 13 are connected to the heavy doping regions at two ends respectively, and a planarization layer 14 is provided on the source 12 and the drain 13.

Since the carrier mobility of the N type transistor is high, the transistors in the display region of the array substrate of the LTPS TFT-LCD are generally the N type transistors. If light is incident onto the active layer of the N type transistor, a leakage current may be generated in the conductive region 19 of the active layer (including the channel region 4 and the light doping regions 5) of the N type transistor, thus a pixel voltage for charging pixel electrodes may be influenced, resulting in a poor display characteristic of the display (degraded image quality). As light-induced leakage current of the N type transistor in the display region is great, a light-shielding layer 2 is commonly formed under the N type transistor in the display region using a light-shielding layer mask plate 15 as shown in FIG. 1 to reduce the light-induced leakage current.

As shown in FIG. 1 and FIG. 2, as the P type transistor and the N type transistor have advantages of low power consumption and simplicity in circuit structure, transistors in the driving region of the array substrate of the LTPS TFT-LCD generally includes N type transistors and P type transistors. The driving region refers to a region which is positioned at the periphery of the liquid crystal display and shielded by a frame. As the driving region typically is not irradiated by light, therefore no light-shielding layer 2 is provided at the N type transistors.

In manufacturing the N type transistor and the P type transistor, it is required to perform a N type doping and a P type doping on the N type transistor and the P type transistor, respectively, so as to accurately adjust thresholds of the N type transistor and the P type transistor, so that the characteristics of the N type transistor and the P type transistor are symmetrical, thus power consumption of leakage current may be reduced. In the above respective dopings, a doping mask plate 16 shown in FIG. 2 is required, that is to say, the active layers of all of the transistors are doped first without using the doping mask plate 16, so that the transistors become N type transistors, then the doping mask plate 16 is used to shield portions except the P type transistor in the driving region and only the P type transistor is doped so as to convert into the P type transistor.

In summary, two mask plates are required for manufacturing the light-shielding layers 2 and doping the active layers in the prior art, therefore, the number of mask plates is relatively large.

SUMMARY OF THE INVENTION

An object of the present invention is to solve the problem of a large number of mask plates being required in manufacturing the LTPS TFT-LCD in the prior art, and the present invention provides a manufacturing method of a LTPS TFT-LCD, which may use fewer mask plates.

A solution adopted to solve the problem to be solved in the present invention is a manufacturing method of an array substrate, which comprises a step of forming light-shielding layers on a base substrate, and a step of forming first type transistors and second type transistors above the light shielding layers, wherein the step of forming light-shielding layers on a base substrate comprises:

forming a pattern of the light-shielding layers on the base substrate through a patterning process by using a light-shielding layer-doping multiplexing mask plate, wherein the light-shielding layer-doping multiplexing mask plate has a shielding portion corresponding to a conductive region of an active layer of each of the first type transistors in a driving region on the base substrate, and a shielding portion corresponding to a conductive region of an active layer of each of the first type transistors in a display region on the base substrate, the light-shielding layers are formed in positions corresponding to the conductive regions of the active layers of the first type transistors in the driving region and positions corresponding to the conductive regions of the active layers of the first type transistors in the display region, and wherein the step of forming first type transistors and second type transistors above the light shielding layers comprises:
performing a first type doping on active layers of the first type transistors and the second type transistors; and
performing a second type doping on the second type transistors by shielding the conductive regions of the actives of the first type transistors using the light-shielding layer-doping multiplexing mask plate.

Preferably, performing a first type doping on active layers of the first type transistors and the second type transistors comprises:
doping N type atoms into the active layers of the first type transistors and the second type transistors to form N type transistors; and
doping P type atoms into the active layers of the second type transistors to form P type transistors.

Preferably, performing a first type doping on active layers of the first type transistors and the second type transistors comprises:
doping P type atoms into the active layers of the first type transistors and the second type transistors to form P type transistors; and
doping N type atoms into the active layers of the second type transistors to form N type transistors.

Further preferably, the step of forming an active layer comprises following steps:
depositing an amorphous silicon film by a low pressure chemical vapor deposition method, wherein the amorphous silicon film is crystallized into a polycrystalline silicon film as the active layer at a low temperature; or
directly depositing a polycrystalline silicon film as the active layer by a low pressure chemical vapor deposition method.

Another object of the present invention is to provide an array substrate, which comprises a display region for displaying and a driving region at periphery of the display region, wherein the driving region of the base substrate is provided with first type transistors and second type transistors, and the display region of the base substrate is provided with first type transistors, and wherein
a light-shielding layer is provided below conductive regions of active layers of the first type transistors.

Preferably, the first type transistors are N type transistors, and the second type transistors are P type transistors; or
the first type transistors are P type transistors, and the second type transistors are N type transistors.

Preferably, the N type transistors are made by performing N type doping on low temperature polycrystalline silicon, and the P type transistors are made by performing P type doping on low temperature polycrystalline silicon.

Still another object of the present invention is to provide a display panel and a display device, which comprise the above array substrate.

Since the array substrate of the present invention is manufactured by using the above method, that is, two mask plates used in manufacturing the light-shielding layer and the doping process in the prior art are replaced with one light-shielding layer-doping multiplexing mask plate, therefore the number of the mask plates during manufacturing is reduced and the cost is decreased. Meanwhile, providing of the light-shielding layer below the N type transistors in the driving region of the array substrate may prevent light-induced leakage current from occurring in the conductive region. Therefore, the display panel and the display device comprising the array substrate are low in manufacturing cost and power consumption.

wherein:
1—base substrate; 2—light-shielding layer; 3—buffer layer; 4—channel region of N type transistor; 5—light doping region of N type transistor; 6—heavy doping region of N type transistor; 7—heavy doping region of P type transistor; 8—channel region of P type transistor; 9—insulation layer; 10—gate; 11—gate insulation layer; 12—source; 13—drain; 14—planarization layer; 15—light-shielding layer mask plate; 16—doping mask plate; 17—light-shielding layer-doping multiplexing mask plate; 18—active layer; and 19—conductive region.

DETAILED DESCRIPTION OF THE EMBODIMENTS

In order to make persons skilled in the art better understand solutions of the present invention, the present invention will be further described in detail below in conjunction with the drawings and embodiments.

Embodiment 1

As shown in FIG. 3 to FIG. 6, the present embodiment provides an array substrate and a manufacturing method thereof.

Figure 1:
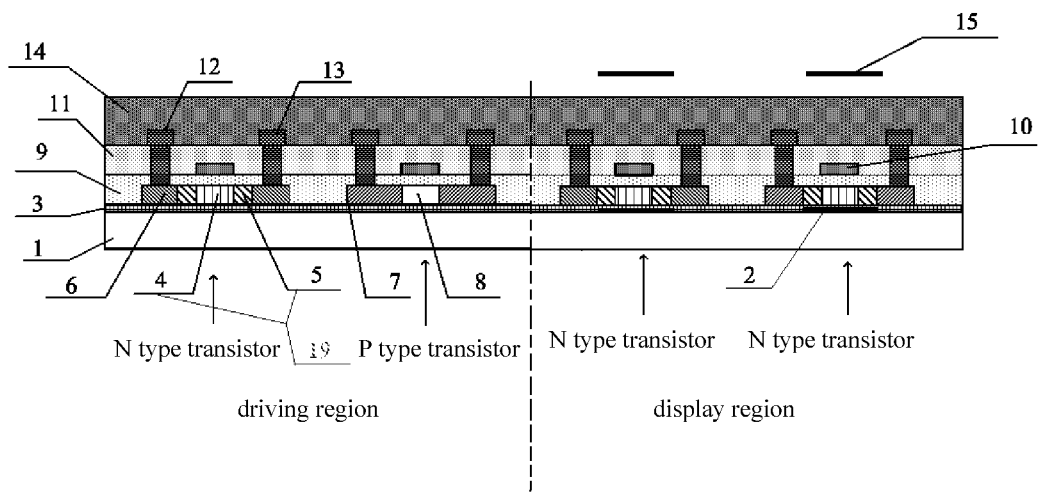
FIG. 1 is a diagram illustrating a structure of an array substrate manufactured in the prior art and a using position of a light-shielding layer mask plate.
Figure 2:
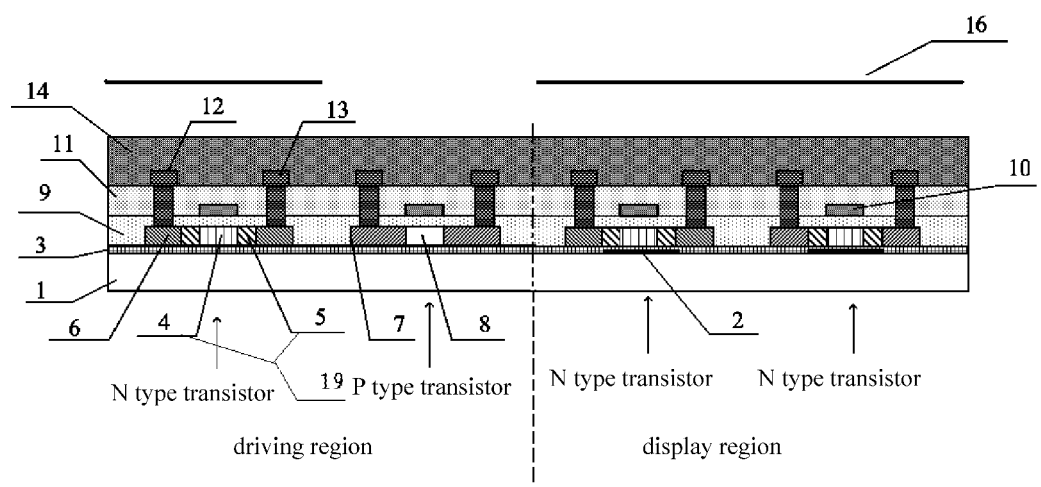
FIG. 2 is a diagram illustrating a structure of an array substrate manufactured in the prior art and a using position of a doping mask plate.
Figure 3:
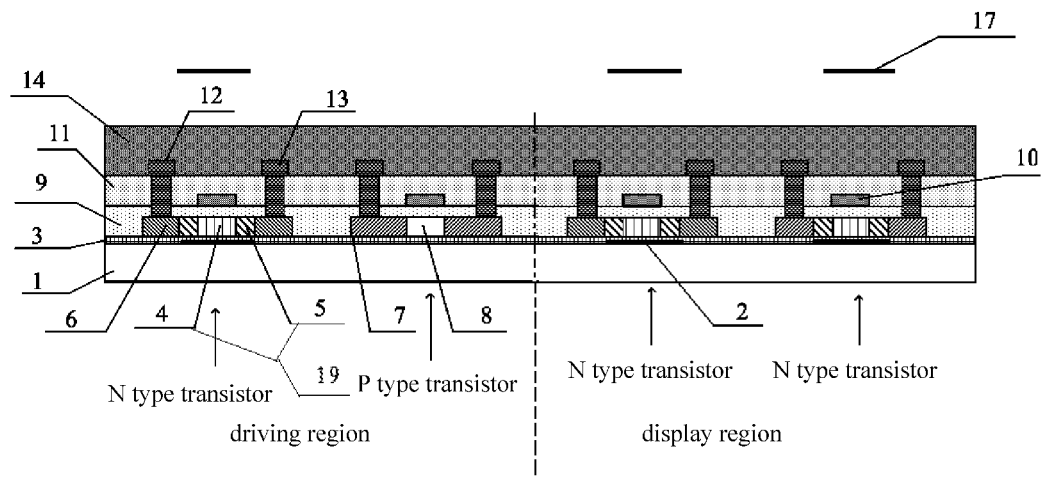
FIG. 3 is a diagram illustrating a structure of an array substrate manufactured in an embodiment 1 of the present invention and a using position of a light-shielding layer-doping multiplexing mask plate.

As shown in FIG. 3, the present embodiment provides an array substrate, which comprises a base substrate 1, the base substrate 1 comprises a display region for displaying and a driving region in the periphery of the display region (in a display device, the driving region is shielded by a frame), wherein the driving region of the base substrate 1 is provided with first type transistors and second type transistors, and the display region of the base substrate 1 is provided with first type transistors, and wherein a light-shielding layer 2 is provided below the conductive region of the active layer of each of the first type transistors.

Specifically, in the array substrate in FIG. 3, the first type transistors correspond to N type transistors, and the second type transistors correspond to P type transistors, of course, it is possible that, the first type transistors correspond to P type transistors and the second type transistors correspond to N type transistors. As shown in FIG. 3, the array substrate comprises: a base substrate 1; and a plurality of light-shielding layers 2 provided on the base substrate 1, wherein the light-shielding layers 2 are located below the conductive regions of the active layers of the N type transistors of the array substrate, and each of the N type transistors (including the N type transistors in the display region and the driving region) has the light-shielding layer 2, and wherein the conductive region includes a channel region 4 of the N type transistor and light doping regions 5 of the N type transistor.

The light-shielding layers 2 are provided with a buffer layer 3 thereon, and N type transistors and P type transistors are provided on the buffer layer 3, as shown in FIG. 3, N type transistors are provided in the display region, and an N type transistor and a P type transistor are provided in the driving region. The active layer of the N type transistor sequentially includes a conductive region 19 and heavy doping regions 6 of the N type transistor from the center to two sides thereof, the conductive region 19 includes a channel region 4 of the N type transistor, and light doping regions 5 of the N type transistor, and the active layer of the P type transistor includes a channel region 8 of the P type transistor in the center and heavy doping regions 7 of the P type transistor at ends thereof.

With respect to each of the N type transistor and the P type transistor, an insulation layer 9 is provided on the active layer, a gate 10 is provided on the insulation layer 9, a source 12 and a drain 13 are provided above the gate 10, the source 12 and the drain 13 are connected to the heavy doping regions at two ends respectively, and a planarization layer 14 is provided on the source 12 and the drain 13.

As shown in FIG. 3, the light-shielding layer 2 covers the channel region 4 of the N type transistor and at least a part of the light doping region 5 of the N type transistor, in the present embodiment, each of the N type transistors (including the N type transistors in the display region and the driving region) is provided with a light-shielding layer 2, the light-shielding layer 2 below the N type transistor in the display region may reduce the leakage current, and improve the display quality of the display. When light (emitted from the backlight, for example) is not shielded by a light-shielding member (light-shielding glue tape), or light is irradiated to the conductive region of the active layer of the N type transistor in the driving region due to some other reasons, the light-shielding layer 2 may shield the above light so as to prevent the light-induced leakage current from being generated in the conductive region.

It should be understood that, in special applications, the above N type transistors and P type transistors may be exchangeable, and in the present embodiment, although the N type transistors and P type transistors are made by low temperature polycrystalline silicon doping, in fact, complementary metal oxide semiconductor transistors (CMOS transistors) may also be used.

Figure 4:
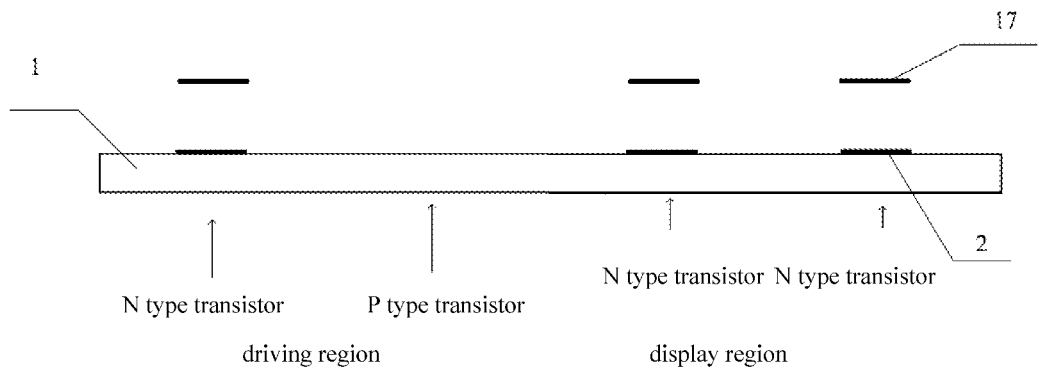
FIG. 4 is a diagram illustrating usage of the light-shielding layer-doping multiplexing mask plate in the embodiment 1 of the present invention in manufacturing the light-shielding layer.
Figure 5:
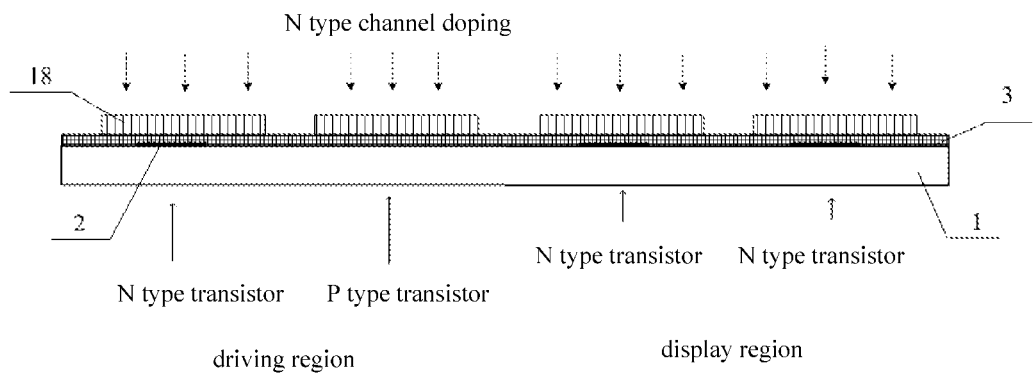
FIG. 5 is a diagram illustrating an N type channel doping performed on the array substrate in the embodiment 1 of the present invention.
Figure 6:
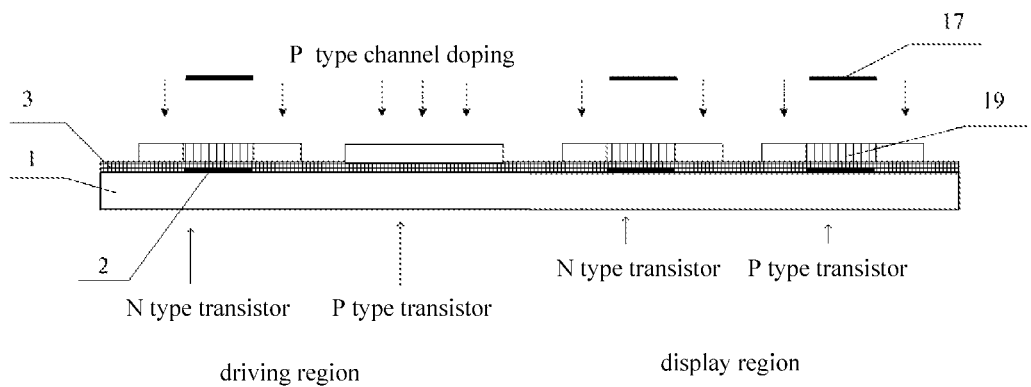
FIG. 6 is a diagram illustrating a P type channel doping performed on the array substrate and usage of the light-shielding layer-doping multiplexing mask plate in the embodiment 1 of the present invention.

The manufacturing method of the above array substrate, as shown in FIG. 4 to FIG. 6, comprises:

S01, forming the light-shielding layers on the base substrate 1 through a patterning process by using a light-shielding layer-doping multiplexing mask plate 17.

The patterning process in the present invention includes a part or all of photoresist application, mask, exposure, development, etching, photoresist peeling off and the like, and the present embodiment is explained by taking the positive photoresist as an example. The above patterning process belongs to the prior art and will not be repeated herein. The above light-shielding layers 2 may be made of various metal materials, such as chrome, gold, aluminum, copper and the like, which can shield light.

As shown in FIG. 4 and FIG. 5, the light-shielding layers 2 are formed on the base substrate 1 through a patterning process by using a light-shielding layer-doping multiplexing mask plate 17. The light-shielding layer-doping multiplexing mask plate 17 includes a shielding portion corresponding to the conductive region of the active layer of the N type transistor in the driving region, so that, in this step, the conductive region of the active layer of each N type transistor is formed with a light-shielding layer 2 therebelow, that is, the light-shielding layer 2 is also formed at the conductive region of the active layer of each N type transistor in the driving region.

In the prior art, since the conductive region of the active layer of the N type transistor in the driving region is usually not irradiated by light, no light-shielding layer 2 is provided thereat, however, apparently, there is no adverse effect if the light-shielding layer 2 is added there, and the light-shielding layer 2 may prevent the light-induced leakage current from being generated in the conductive region, and meanwhile, with the light-shielding layer-doping multiplexing mask plate 17, the number of mask plates to be used in sequential steps can be reduced, and the manufacturing cost of the array substrate can be decreased.

A buffer layer 3 is formed on the light-shielding layers 2, and the process for forming the buffer layer 3 may be an existing process, and will not be repeated herein.

S02, manufacturing the active layer.

As shown in FIG. 5, by using silane gas as a material, an a-Si:H film is deposited through a low pressure chemical vapor deposition method at a temperature about 550□, next, the film is melted at a high temperature more than 600□ and then generates crystal nucleuses by lowering the temperature, the melt silicon continues to crystallize on the crystal nucleuses with the temperature's lowering so that the crystalline grains are enlarged, so that the film is converted into a polycrystalline silicon film, thus the active layer 18 is formed.

The polycrystalline silicon film may also be formed by a direct method, that is, the silane gas is directly deposited on the base substrate 1, the deposition parameters are as follows: the pressure of the silane gas is 13.3~26.6 Pa, the deposition temperature is 580~630□ and the growth speed is 5~10 nm/min.

It should be understood that, the low temperature polycrystalline silicon may also be prepared through other processes, for example, an excimer laser crystallization, a rapid thermal annealing method and the like, which will not be discussed herein.

S03, performing N type doping on the active layer.

As shown in FIG. 5, N type atoms are doped into the active layer 18, a threshold voltage of the active layer 18 may become a threshold voltage required by the N type transistor through thus doping, and then a pattern of the active layer 18 is formed by a patterning process. The N type doping refers to doping phosphorus atoms or antimony atoms into the active layer 18 using an existing diffusing method or ion implantation method.

S04, performing P type doping on the active layer.

Specifically, as shown in FIG. 6, the conductive regions 19 of the active layers of all of the N type transistors on the array substrate are shielded using the above light-shielding layer-doping multiplexing mask plate 17 (size of the light-shielding layer-doping multiplexing mask plate 17 matches with that of the conductive regions 19), P type doping is performed on the active layers, which are in corresponding regions, of the exposed P type transistors and the active layers, which are in corresponding regions, of the partially exposed N type transistors, wherein the P type doping refers to doping indium atoms or boron atoms into the active layers 18 using an existing diffusing method or ion implantation method. Since the light-shielding layer-doping multiplexing mask plate 17 shields the conductive regions 19 of all of the N type transistors, the P type doping may be performed on the non-shielded regions to form a threshold voltage required by the P type transistor, which is convenient to adjust. It can be seen that, the light-shielding layer-doping multiplexing mask plate 17 in the present embodiment can be used to not only manufacture the light-shielding layers 2, but also perform doping on the N type transistors, that is, a single mask plate may be used in two steps, so that the number of the mask plates is reduced by one, and the manufacturing cost is decreased.

While parts of the active layers of the partially exposed N type transistors are doped to be of weak P type, they can be compensated through subsequent N type heavy doping.

S05, with reference to FIG. 5, an N type heavy doping is performed on the active layers, wherein the N type heavy doping means using the above N type doping method and increasing the concentrations of the phosphorus atoms or antimony atoms doped into the active layers. Through the N type heavy doping, the active layers, which are doped to be of weak P type, of the N type transistors in the step S04 can be compensated for N type heavy doping, and finally, a channel region 4 of the N type transistor and light doping regions 5 of the N type transistor may be formed in each of the conductive regions of the active layers of the N type transistors; heavy doping regions 6 of the N type transistor are formed at ends of the active layer of each N type transistor; next, a channel region 8 and heavy doping regions 7 of the P type transistor at two ends of the channel region 8 are formed in the active layer of each P type transistor; and an insulation layer 9, gates 10, a gate insulation layer 11, sources 12, drains 13 and a planarization layer 14 are formed on the active layers.

It should be understood that, in the above manufacturing method, except the common light-shielding layer-doping multiplexing mask plate 17 is used in step S01 and step S04, methods and materials used in other steps may be existing methods and materials.

In the array substrate and the manufacturing method thereof, two mask plates used in manufacturing the light-shielding layer and the doping process in the prior art are replaced with one light-shielding layer-doping multiplexing mask plate, therefore the number of the mask plates during manufacturing is reduced and the cost is decreased. Meanwhile, providing the light-shielding layers below the N type transistors in the driving region of the array substrate may prevent light-induced leakage current from being generated in the conductive region.

Embodiment 2

The present embodiment provides a display panel comprising the above array substrate.

In manufacturing the display panel of the present invention, two mask plates used in manufacturing the light-shielding layer and the doping process in the prior art are replaced with one light-shielding layer-doping multiplexing mask plate, therefore the number of the mask plates during manufacturing is reduced and the cost is decreased. Meanwhile, providing of the light-shielding layer below the N type transistors in the driving region of the array substrate may prevent light leakage current from being generated in the conductive region.

Embodiment 3

The present embodiment provides a display device comprising the above display panel.

In manufacturing the display device of the present invention, two mask plates used in manufacturing the light-shielding layer and the doping process in the prior art are replaced with one light-shielding layer-doping multiplexing mask plate, therefore the number of the mask plates during manufacturing is reduced and the cost is decreased. Meanwhile, providing of the light-shielding layer below the N type transistor in the driving region of the array substrate may prevent light-induced leakage current from being generated in the conductive region.

It should be noted that, FIG. 1 to FIG. 6 of the present invention only show the relative position relationship between the mask plates and the light-shielding layers and the active layers, which does not mean that the mask plates are used in the situation shown in the drawings, for example, the light-shielding layer-doping multiplexing mask plate 17 in FIG. 3 is used to form the light-shielding layers 2 on the base substrate 1 without any other structure thereon, rather than form the light-shielding layers 2 after other structures have been formed on the base substrate 1.

It should be understood that, the above embodiments are only exemplary embodiments used to explain the principle of the present invention and the protection scope of the present invention is not limited thereto. The person skilled in the art can make various variations and modifications without departing from the spirit and scope of the present invention, and these variations and modifications should be considered to belong to the protection scope of the invention.

The invention claimed is:

1. A manufacturing method of an array substrate comprising a step of forming light-shielding layers on a base substrate, and a step of forming first type transistors and second type transistors above the light shielding layers, wherein the step of forming light-shielding layers on a base substrate comprises:

forming a pattern of the light-shielding layers on the base substrate through a patterning process by using a light-shielding layer-doping multiplexing mask plate, wherein the light-shielding layer-doping multiplexing mask plate has a shielding portion corresponding to a conductive region of an active layer of each of the first type transistors in a driving region on the base substrate, and a shielding portion corresponding to a conductive region of an active layer of each of the first type transistors in a display region on the base substrate, the light-shielding layers are formed in positions corresponding to the conductive regions of the active layers of the first type transistors in the driving region and positions corresponding to the conductive regions of the active layers of the first type transistors in the display region, the step of forming first type transistors and second type transistors above the light-shielding layers comprises:

performing a first type doping on active layers of the first type transistors and the second type transistors; and performing a second type doping on the second type transistors by shielding the conductive regions of the active layers of the first type transistors using the light-shielding layer-doping multiplexing mask plate.

2. The manufacturing method of an array substrate of claim 1, wherein performing a first type doping on active layers of the first type transistors and the second type transistors comprises:

doping N type atoms into the active layers of the first type transistors and the second type transistors to form N type transistors; and doping P type atoms into the active layers of the second type transistors to form P type transistors.

3. The manufacturing method of an array substrate of claim 1, wherein performing a first type doping on active layers of the first type transistors and the second type transistors comprises:

doping P type atoms into the active layers of the first type transistors and the second type transistors to form P type transistors; and doping N type atoms into the active layers of the second type transistors to form N type transistors.

4. The manufacturing method of an array substrate of claim 1, wherein the step of forming an active layer comprises following steps:

depositing an amorphous silicon thin film by a low pressure chemical vapor deposition method, wherein the amorphous silicon film is crystallized into a polycrystalline silicon film as the active layer at a low temperature; or directly depositing a polycrystalline silicon film as the active layer by a low pressure chemical vapor deposition method.

5. The manufacturing method of an array substrate of claim 2, wherein the step of forming an active layer comprises following steps:

depositing an amorphous silicon thin film by a low pressure chemical vapor deposition method, wherein the amorphous silicon film is crystallized into a polycrystalline silicon film as the active layer at a low temperature; or directly depositing a polycrystalline silicon film as the active layer by a low pressure chemical vapor deposition method.

6. The manufacturing method of an array substrate of claim 3, wherein the step of forming an active layer comprises following steps:

depositing an amorphous silicon thin film by a low pressure chemical vapor deposition method, wherein the amorphous silicon film is crystallized into a polycrystalline silicon film as the active layer at a low temperature; or directly depositing a polycrystalline silicon film as the active layer by a low pressure chemical vapor deposition method.

\* \* \* \* \*